(12) United States Patent
Lee et al.

(10) Patent No.: US 11,409,048 B2
(45) Date of Patent: Aug. 9, 2022

(54) TUNABLE WAVELENGTH FILTERING DEVICE THAT IS TUNED BY ALTERING THE ANGLE OF THE OPTICAL BEAM THAT IS INCIDENT ON A FILTER

(71) Applicant: DICON FIBEROPTICS, INC., Richmond, CA (US)

(72) Inventors: Jeffrey Lee, El Sobrante, CA (US); Junying Lu, Castro Valley, CA (US); Robert E. Schleicher, Danville, CA (US); Ho-Shang Lee, El Sobrante, CA (US)

(73) Assignee: DICON FIBEROPTICS, INC., Richmond, CA (US)

( * ) Notice: Subject to any disclaimer, the term of this patent is extended or adjusted under 35 U.S.C. 154(b) by 237 days.

(21) Appl. No.: 16/722,489

(22) Filed: Dec. 20, 2019

(65) Prior Publication Data
US 2021/0141159 A1 May 13, 2021

Related U.S. Application Data

(60) Provisional application No. 62/935,023, filed on Nov. 13, 2019.

(51) Int. Cl.
*G02B 6/35* (2006.01)
*G02B 6/293* (2006.01)
(Continued)

(52) U.S. Cl.
CPC ....... *G02B 6/3518* (2013.01); *G02B 6/29389* (2013.01); *G02B 26/0833* (2013.01); *B81B 3/0083* (2013.01)

(58) Field of Classification Search
CPC ............. G02B 6/3518; G02B 6/29389; G02B 6/0833; G02B 6/3512; G02B 6/29361;
(Continued)

(56) References Cited

U.S. PATENT DOCUMENTS 6,628,856 B1   9/2003  Costello et al.
6,782,153 B2 *  8/2004  Polinsky ............ G02B 26/0841
                                                          398/43
(Continued)

OTHER PUBLICATIONS

Dr. Rudiger Paschotta, https://www.rp-photonics.com/interference_filters.html, 2016 (Year: 2016).*
(Continued)

*Primary Examiner* — Ryan A Lepisto
*Assistant Examiner* — Erin D Chiem
(74) *Attorney, Agent, or Firm* — Vierra Magen Marcus LLP (57) ABSTRACT

A tunable wavelength filtering device is presented in which the tuning mechanism is based on altering the incident angle to an optical thin film coating stack, or thin film optical filter. Rotating mirrors, such as Micro-Electro-Mechanical Systems (MEMS) tilt-mirrors, are used to alter the incident angle of the optical beam coming from an input fiber, and also to aim or align the exiting beam to an output optical fiber. The optical thin film coating stack can be implemented onto a glass substrate, to form a thin film filter chip. The thin film filter chip can be fixed in place, and the incident angle and exiting angle of the optical beam is varied by adjusting the tilt angle of the two rotating mirrors.

27 Claims, 6 Drawing Sheets

(51) Int. Cl.
  *G02B 26/08* (2006.01)
  *G02B 6/00* (2006.01)
  *B81B 3/00* (2006.01)
(58) Field of Classification Search
  CPC .... G02B 6/29395; G02B 6/007; B81B 3/0083
  See application file for complete search history.

(56) References Cited

U.S. PATENT DOCUMENTS

| | | | | |
|---|---|---|---|---|
| 6,791,694 | B2* | 9/2004 | Pezeshki | G02B 6/29358 356/519 |
| 6,838,738 | B1 | 1/2005 | Costello et al. | |
| 7,085,492 | B2* | 8/2006 | Ibsen | G01J 3/02 398/33 |
| 7,257,288 | B1* | 8/2007 | Strasser | G02B 6/29383 385/24 |
| 7,899,330 | B2 | 3/2011 | Ye et al. | |
| 10,197,738 | B2 | 2/2019 | Lee et al. | |
| 2008/0085119 | A1* | 4/2008 | Ye | G02B 6/29311 398/85 |
| 2012/0257279 | A1* | 10/2012 | Hsieh | G02B 26/105 359/572 |
| 2018/0091229 | A1* | 3/2018 | Yang | G02B 26/007 |
| 2018/0329147 | A1* | 11/2018 | Lee | G02B 6/4206 |

OTHER PUBLICATIONS

Dr. Rudiger Paschotta,, https://www.rp-photonics.com/dielectric_mirrors.html, 2016 (Year: 2016).*

* cited by examiner

TUNABLE WAVELENGTH FILTERING DEVICE THAT IS TUNED BY ALTERING THE ANGLE OF THE OPTICAL BEAM THAT IS INCIDENT ON A FILTER

PRIORITY CLAIM

This application claims the benefit of U.S. provisional pat. app. 62/935,023, filed Nov. 13, 2019, which is hereby incorporated in its entirety by this reference.

BACKGROUND

This disclosure relates generally to optical components used in optical communication networks, and specifically to a tunable wavelength filtering device.

Optical components that switch, attenuate, filter, and process optical signals are widely deployed in optical networks, typically in the 1550 nm or 1310 nm wavelength windows. A general description of optical networking functions and applications can be found in "Introduction to DWDM Technology", by Stamatios Kartalopoulos, Wiley-Interscience, 2000. These optical networking functions include the function of selecting or removing a particular wavelength or group of wavelengths from an optical signal that contains multiple wavelengths. In modern, reconfigurable optical networks, it is highly desirable to be able to dynamically modify the particular wavelength(s) that are being selected or removed. There is therefore a need to provide tunable optical filters. Tunable optical filters may also be used as noise filters, in conjunction with transmitters and transceivers that use tunable lasers.

SUMMARY

In one set of embodiments, an optical device includes an input port configured to provide an input beam of light and an output port configured to provide an output beam of light from the optical device. A fixed optical filter us located in an optical path from the input port and to the output port and is configured to transmit light having a spectral response dependent on an angle with which a beam of light is incident upon it. A first mirror is located in the optical path intermediate to the input port and the optical filter, where the first mirror is configured to reflect an incident beam of light from the input port onto the fixed optical filter and is rotatable in response to a first control signal to vary the angle with which the incident beam of light reflected from the input port is incident upon the fixed optical filter. A second mirror is located in the optical path intermediate to the optical filter and the output port and is rotatable in response to a second control signal to direct a beam of light transmitted by the optical filter to the output port.

In other embodiments, an optical device includes: an optical input port; an optical output port; an optical filter; and first and second rotatable minors. The optical filter is configured to transmit light have a spectral response dependent on an angle with which a beam of light is incident thereupon. The first rotatable mirror is configured to reflect a beam of light incident thereon from the input port on to the optical filter. The optical device also includes one or more control circuits connected to the first rotatable mirror and the second rotatable mirror and connected to receive a user input. The one or more control circuits configured to: align the first rotatable mirror to direct the beam of light to be incident upon the optical filter with an angle dependent upon the user input; and align the second rotatable minor to direct to the first optical output light transmitted by the optical filter from the beam of light incident upon the optical filter.

Various aspects, advantages, features and embodiments are included in the following description of examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

In FIG. 1C a reflective thin film filter is used. In FIG. 1D a transmissive thin film filter is used.

DETAILED DESCRIPTION

The following presents embodiments of a tunable wavelength filtering device in which the tuning mechanism is based on altering the incident angle to an optical thin film coating stack. Rotating mirrors, such as Micro-Electro-Mechanical Systems (MEMS) tilt-mirrors, are used to alter the incident angle of the optical beam coming from an input fiber, and also to aim or align the exiting beam to an output optical fiber.

More specifically, the following presents embodiments of a tunable wavelength filtering device in which the tuning mechanism is based on altering the incident angle to an optical thin film coating stack, or thin film optical filter, that is configured to transmit or reflect light having a spectral response dependent on an angle with which a beam of light is incident upon it. Rotating mirrors, such as Micro-Electro-Mechanical Systems (MEMS) tilt-mirrors, are used to alter the incident angle of the optical beam coming from an input fiber, and also to aim or align the exiting beam to an output optical fiber. Embodiments for the optical thin film coating stack can be implemented onto a glass substrate, to form a thin film filter chip. The thin film filter chip can be fixed in place, and the incident angle and exiting angle of the optical beam is varied by adjusting the tilt angle of the two rotating mirrors.

Figure 1A:
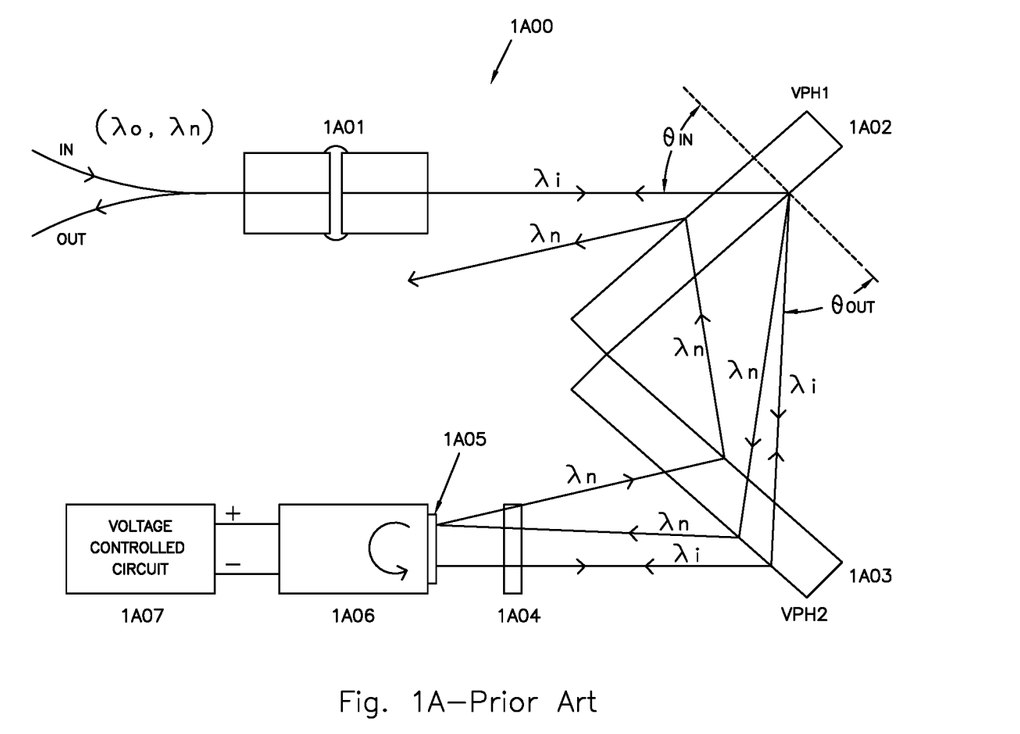
FIG. 1A illustrates an example of a tunable optical filter having a rotating MEMS tilt-mirror, one or more diffraction gratings, an input fiber, and an output fiber.

FIG. 1A shows a conceptual view of a tunable optical filter in which a MEMS tilt-mirror is used to steer an optical beam that passes through one or more fixed-position diffraction grating(s). FIG. 1A is excerpted from U.S. Pat. No. 7,899,330, and shows an embodiment in which the optical beam passes through two diffraction gratings. Sub-assembly 1A01 comprises a fiber ferrule that holds an input fiber and an output fiber, and a collimating lens. The optical signal on the input fiber consists of multiple wavelengths, each carrying its own information. The multi-wavelength collimated beam that emerges from sub-assembly 1A01 passes through two diffraction gratings 1A02 and 1A03, which serve to disperse the multiple wavelengths, such that they exit the diffraction gratings at slightly different angles. In this example, two gratings are used, to provide more angular dispersion than would be achieved with a single grating. All of the dispersed wavelengths hit the surface of rotating MEMS tilt-mirror 1A05, which is mounted on a chip header or other structure 1A06. The precise tilt angle of the tilt-mirror 1A05 is controlled by the voltage controlled circuit 1A07. Based on the applied voltage, and the resulting tilt angle, only a small subset of the input wavelength range (for example, a single selected wavelength) will be aimed or directed properly, back through the diffraction gratings 1A02 and 1A03, to sub-assembly 1A01 and the core of the output fiber. In FIG. 1A, an additional optical element 1A04 is also shown. For example, a quarter-wave plate may be used to rotate the polarization of the light between the two passes of the diffraction gratings, in order to reduce polarization-dependent loss (PDL) in the selected wavelength.

In the example described in FIG. 1A, the moving part of the optical component is a mirror, used to steer optical beams, or to change the incident angle of light onto other optical elements that are fixed in place. In the other embodiments shown in FIGS. 1B-1D, tunable optical filters are implemented by physically moving or rotating a thin film optical coating stack, or thin film filter chip.

Figure 1B:
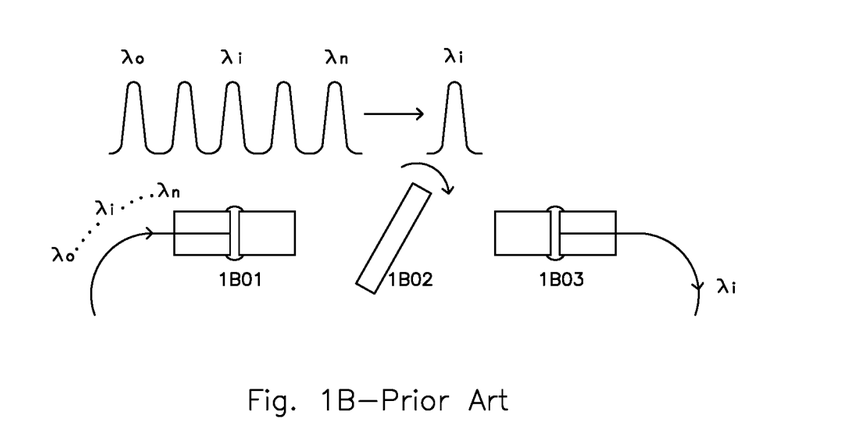
FIG. 1B provides a conceptual representation of a tunable optical filter in which a thin film filter chip is rotated to adjust the wavelength or wavelengths that are passed by the filter.

FIG. 1B shows a conceptual drawing of an embodiment of a tunable optical filter that uses a rotating thin film filter chip. The thin film filter chip may be implemented by a Fabry-Perot filter with a single resonant cavity. Alternately, it may be a multi-cavity optical filter, with a flatter passband. Multiple wavelengths on an input fiber pass through sub-assembly 1B01, comprising a single-fiber ferrule and a collimating lens, and then pass through a thin film filter chip 1B02, that can be rotated via some mechanism, such as a small motor, or even a manual mechanism. A single selected wavelength or range of wavelengths is passed to sub-assembly 1B03, comprising a focusing lens and a single-fiber ferrule, and is then coupled to the output fiber. The filter chip itself is designed to pass a single, fixed wavelength, or range of wavelengths, when the angle of the chip to the incident beam is 90 degrees. However, when the incident angle of the multi-wavelength beam is changed, by rotating the thin-film filter chip, the selected or tuned wavelength is changed or shifted, to a shorter wavelength.

Figure 1C:
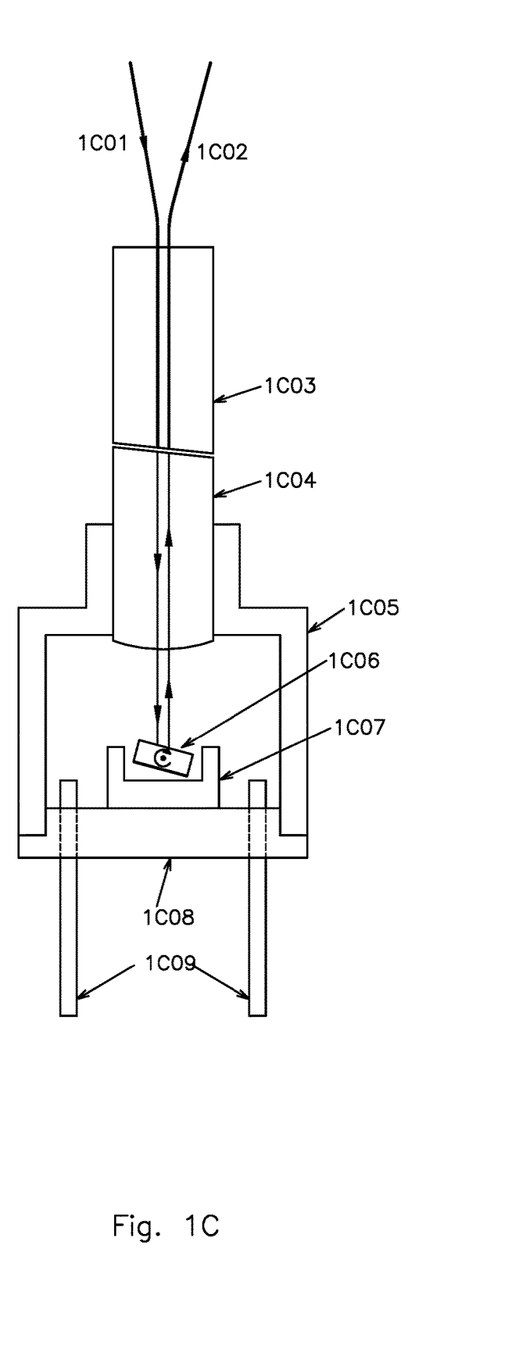
FIGS. 1C and 1D show two embodiments of tunable optical filters in which a MEMS actuator is used to tilt or rotate a thin film optical filter.
Figure 1D:
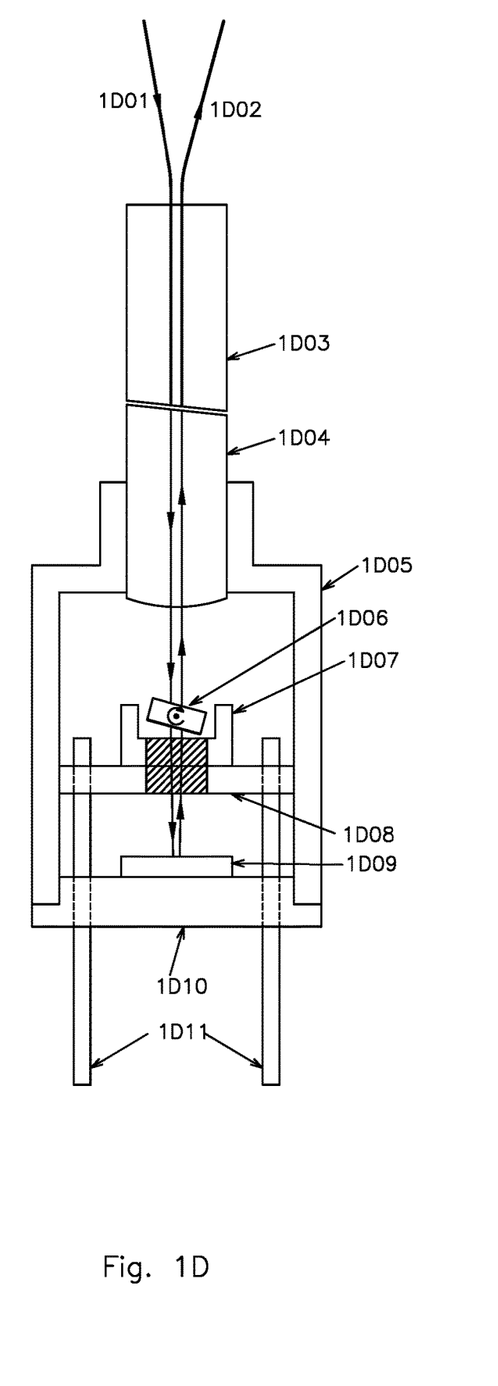

FIGS. 1C and 1D show other arrangements, in which a rotating MEMS actuator is used to rotate a discrete optical component, or element, made of a material that may be dissimilar to that of the MEMS actuator, as excerpted from U.S. Pat. No. 10,197,330. In both of these embodiments, the discrete optical component or element is a thin film filter chip. As shown in FIG. 1C, a fiber ferrule 1C03 holds an input fiber 1C01, and an output fiber 1C02. The input signal on input fiber 1C01 would typically comprise multiple wavelengths, each wavelength carrying its own information. Light exiting the input fiber 1C01 passes through collimating lens 1C04, forming a collimated beam.

The collimated beam that emerges from lens 1C04 is directed at a rotatable optical element 1C06, in this case a reflective thin film filter chip, that is rotated by a MEMS actuator 1C07. Note that the rays shown in FIG. 1C (and FIG. 1D, as well as subsequent figures) make no attempt to fully depict the effect of optical elements such as the collimating lens, and are just intended to show the approximate optical path through the embodiment. The depiction of the MEMS actuator 1C07 is for illustration of the basic concept of this embodiment (and the embodiment shown in FIG. 1D), and does not reflect the actual structure of the MEMS actuator. The rotational axis of the rotating optical element (for example, a thin film filter chip) 1C06 is shown as being perpendicular to the page. In this embodiment, the thin film filter chip 1C06 is attached in some way to the rotating or movable portion of the MEMS actuator 1C07, which has a rotational axis that is also perpendicular to the page.

MEMS actuator 1C07 would typically be fabricated from silicon, or some other material that is fabricated using semiconductor processing methods. However, the thin film filter chip 1C06 would typically be fabricated on a glass substrate. As such, the material of the thin film filter chip 1C06 is dissimilar from that of the MEMS actuator 1C07, and the two elements would be fabricated separately. The thickness of the thin film filter chip and its substrate 1C06 is also substantially larger than the thickness of the mirror portion of typical MEMS tilt-mirror structures, and of relatively greater mass. Thus, the MEMS actuator 1C07 must be able to carry, and rotate, a relatively thick element, with relatively large mass, that is fabricated separately, and is attached to the MEMS actuator using some form of metallic bonding, or through the use of epoxy, or some other glue.

The MEMS actuator is bonded or attached to a chip header 1C08, typically via a metallic bonding process, or by using a die-attach glue, which may be an electrically-conductive epoxy. The housing 1C05 serves to hold lens 1C04 in place, and is also bonded or welded to the chip header 1C08, forming a seal around the MEMS actuator and the rotating optical element that provides protection from environmental conditions. The chip header's electrical pins, 1C09, are used to provide one or more control voltages, as well as an electrical ground connection, to the MEMS actuator 1C07. Typically, wire bonds would be used to provide electrical connections from the tops of the pins, 1C09, to electrical contacts or pads on the fixed portion of the MEMS actuator.

In the embodiment shown in FIG. 1C, the thin film filter chip 1C06 is depicted as being a reflective thin film filter, such that the filtered wavelength(s) are reflected back towards the lens 1C04. Another embodiment is shown in FIG. 1D. The basic structure of this embodiment is similar to the embodiment shown in FIG. 1C. However, in the embodiment of FIG. 1D, the rotating optical element is a transmissive thin film filter. Fiber ferrule 1D03 holds an input fiber 1D01, and an output fiber 1D02. Multi-wavelength light coming in on input fiber 1D01 is collimated by lens 1D04, and the resulting beam is incident on the rotating thin film filter chip 1D06, which is rotated by MEMS actuator 1D07. Light that passes through the transmissive thin film filter chip 1D06, also passes through holes or apertures in both the MEMS actuator 1D07, and the underlying chip header 1D08. These holes are indicated in FIG. 1D by the cross-hatched areas of MEMS actuator 1D07 and chip header 1D08. The light that passes through these holes is then reflected by the fixed mirror 1D09, which is mounted on its own header 1D10. After passing through the rotating thin film filter chip a second time, the light is focused by lens 1D04 onto output fiber 1D02. The light that is coupled to the output fiber 1D02 will therefore have been shaped or filtered by two passes of the thin film filter chip 1D06.

Depending on the angle of rotation of the thin film filter chip 1D06, a specific wavelength or range of wavelengths will be passed through the thin-film optical filter, to be coupled onto the output fiber. Electrical pins 1D11 are used to bring the necessary control voltage(s) to the MEMS actuator 1D07, as well as electrical ground, passing through both the outer header 1D10, as well as the MEMS chip header 1D08. The pins are sealed to the outer header 1D10, but may simply pass through the MEMS chip header 1D08. Typically, wire bonds would be used between the tops of the pins 1D11, to electrical contacts or pads on the fixed portion of the MEMS actuator 1D07.

Thin film filter chip 1D06 will be designed to pass a specific wavelength or range of wavelengths when the filter chip is perpendicular to the incident beam. The thin film filter chip may be a single-cavity Fabry-Perot filter, or a multi-cavity filter with flatter passband characteristic, or any other form of thin film optical filter. Such filters are fabricated by the deposition of multiple layers of dielectric material onto a substrate, typically made of glass. Future references to thin film filters, or to thin film filter chips, may be understood to refer to the entire structure, including both the layers of dielectric material, as well as the underlying substrate. Tilting or rotating the filter chip, including the actual filter structure, via rotation of the MEMS actuator 1D07, will shift the passed wavelength or range of wavelengths to a shorter wavelength or range of wavelengths. However, the amount of wavelength shift per degree of rotation may not be that great, when the filter chip is close to being perpendicular to the incident beam. The amount of wavelength shift per degree of rotation can be increased, by mounting the MEMS actuator 1D07 at some angle with respect to the incident beam. For example, if the total range of motion of the MEMS actuator 1D07 is five degrees, and the MEMS actuator is mounted at an angle of 15 degrees with respect to the perpendicular of the incident beam, then the effective angle of the thin-film filter chip will be 15-20 degrees with respect to the incident beam, rather than 0-5 degrees. This "pre-tilt" will result in a greater effective wavelength tuning range.

In the embodiments shown in FIGS. 1C and 1D the MEMS actuator operates to tilt or rotate a thin film filter chip, comprised of a thin film coating stack on a transparent substrate, that may be relatively large, and has relatively high mass, in comparison to the MEMS actuator itself. The mass of the thin film filter chip creates limits on the speed with which the thin film filter chip can be rotated and may also result in susceptibility to external shock and vibrational forces. If the MEMS actuator is made stronger and rotationally stiffer, in order to compensate for the relatively large mass of the thin film filter chip, then this may result in a reduced range of angular motion, thereby reducing the wavelength tuning range of the device.

To reduce or avoid the movement of the filter, the following presents embodiments of a tunable wavelength filtering device in which an optical thin film coating stack is used as the wavelength filter, and rotating mirrors, such as MEMS tilt-mirrors, are used to alter the incident angle of the optical beam coming from an input fiber and also to aim or align the exiting beam to an output optical fiber, thereby tuning the filter's center wavelength.

Figure 3A:
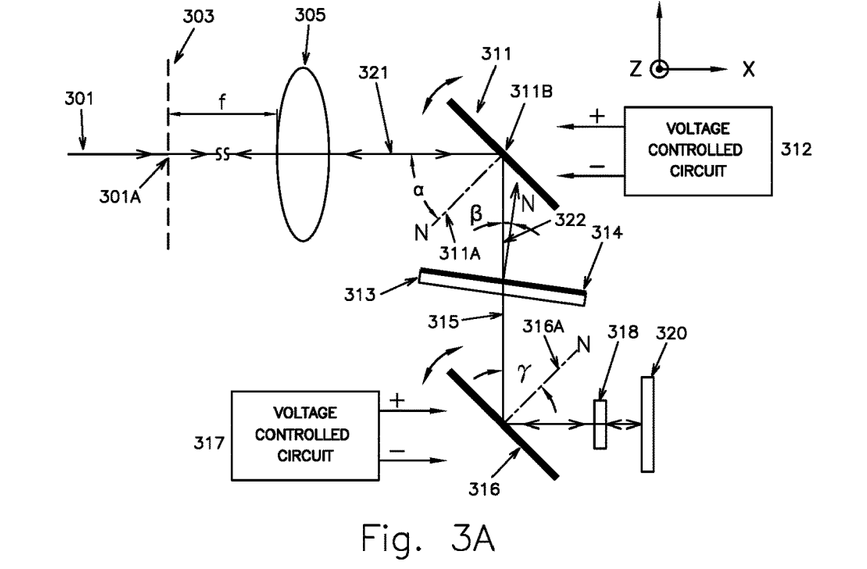
FIGS. 3A, 3B, and 3C show one embodiment comprising a thin film filter chip, a fixed mirror, and two rotating mirrors, that are used to adjust the angles of the optical beam that is incident on the thin film filter chip, and the beam that exits the thin film filter chip, respectively.
Figure 3B:
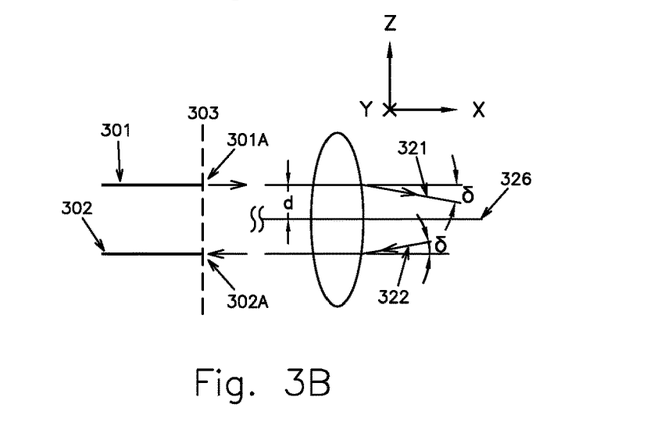
Figure 3C:
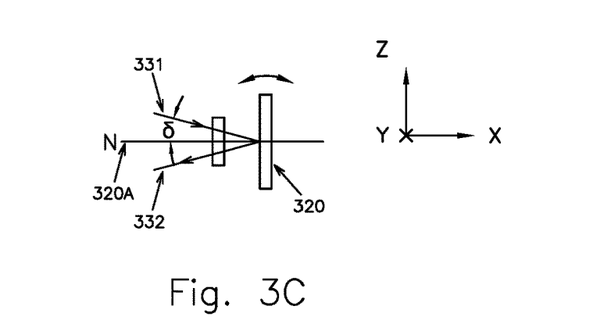

FIG. 3A shows a top view of one embodiment implementing a tunable optical filter in conceptual form. FIGS. 3B and 3C provide detailed views of portions of this embodiment. (Corresponding elements in FIGS. 3A, 3B, and 3C are labeled similarly.) An input optical fiber 301 serves as an optical input port and carries a wavelength spectrum, comprising multiple wavelengths. An optical lens 305 having a focal length f is used to collimate the optical power exiting fiber end 301A, to become a parallel beam 321. Lens 305 can be a conventional convex lens, a cylindrical lens (or C-Lens), a graded-index lens (or GRIN lens), or any other form of lens, as long as it can collimate a divergent beam. The input port of fiber end 301A is positioned at or near the lens' focal plane 303, and at a small distance d off the optical axis 326 of the lens 305, as shown in FIG. 3B, which is a side view of a portion of the embodiment shown in FIG. 3A. Also as shown in FIG. 3B, the collimated beam 321 is bent down toward the optical axis 326 at a small angle δ (typically less than 2 degrees), resulting from the fiber end 301A being off-set slightly along the Z-axis, from the optical axis 326.

As shown in FIG. 3A, the collimated beam 321 strikes a rotating mirror 311 (for example, a MEMS tilt-mirror) with an incident angle α with respect to the normal 311A, and is reflected toward an optical filter 314, coated on a transparent substrate 313. The optical filter 314 is used to transmit or pass a beam 315 having a specific wavelength spectrum, and reflects the remaining spectrum (as will be explained in more detail, below, using FIGS. 2A and 2B). Embodiments for the optical filter 314 can be constructed using a stack of dielectric thin films, coated onto a glass substrate. Depending on the structure of the thin film coatings stack, the optical filter can be a bandpass filter, a long pass filter, a short pass filter, a notch filter, or a specially designed spectrum. In the embodiments primarily being discussed here, the optical filter 314 is fixed, but in alternate embodiments the optical filter 314 can also have the ability to rotate.

Figure 2A:
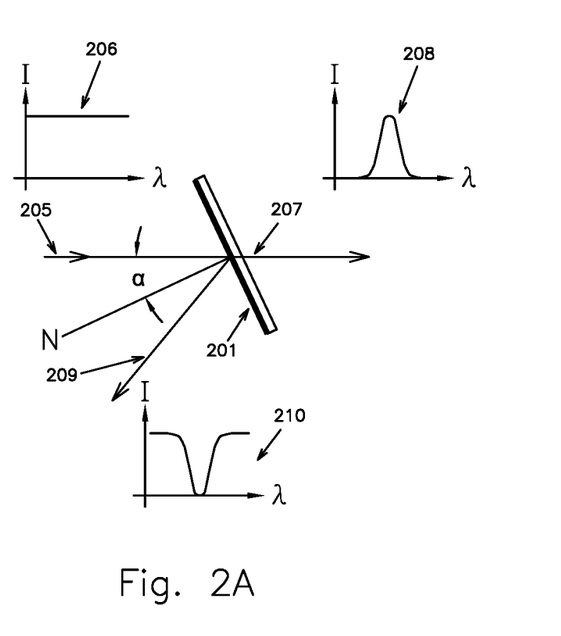
FIGS. 2A and 2B illustrate the relationship between the angle of incidence of a beam that is incident on a thin film optical filter, and the center wavelength of the filter's transmitted and reflected wavelength spectrum.

The rotating mirror 311 rotates around a pivot point 311B, such that the incident angle α to the rotating mirror 311, and consequentially the incident angle β to the optical filter 314, are adjustable. Note that for a given change of incident angle α to the rotating mirror 311, the change of incident angle β to the optical filter 314 will be twice as large. In other words, $\Delta\beta = 2 \cdot \Delta\alpha$. The transmission spectrum of an optical filter generally depends on the incident angle, as described in "Thin-Film Optical Filters", by H. Angus MacLeod, CRC Press, 2010. As illustrated in FIG. 2A, the optical filter 201 is a bandpass filter, typically implemented as an interference filter, using a stack of thin film coatings to create multiple resonant cavities. The input beam 205, with a flat spectrum 206, is incident on the optical filter 201, with an incident angle α. The spectrum of the beam 207 that passes through optical filter 201 is shown as wavelength band 208. The remaining optical power is reflected by the optical filter 201 as beam 209, with wavelength spectrum 210. The peak wavelength of the transmission wavelength band 208 is decreased (to a shorter wavelength) with increased incident angle α.

Figure 2B:
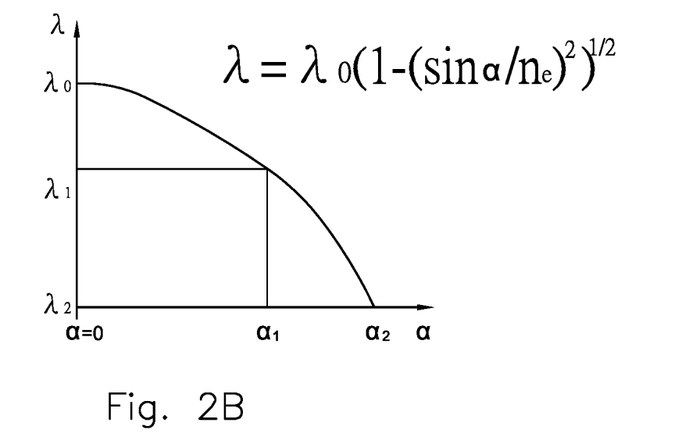

The physical relation between incident angle α and the peak transmission wavelength λ is:

$$\lambda = \lambda_0 (1 - (\sin \alpha / n_e)^2)^{1/2}$$

where $\lambda_0$ is the peak transmission wavelength at zero incident angle and $n_e$ is the effective refractive index of the film stack. This equation is plotted in FIG. 2B. The peak wavelength decreases sharply as the incident angle increases. By tuning or adjusting the incident angle from, for example, zero degrees to 25 degrees, onto a typical narrow bandwidth interference filter as used in DWDM networks, the peak wavelength can be shifted down by more than 40 nm.

In one set of embodiments, the rotating mirrors 311 and 316 can be MEMS devices, although other forms of actuators can be used. As represented in FIG. 3A, the mirrors 311 and 316 can include a MEMS based or other actuator, where the representation of 311 and 316 could represent a rotating MEMS tilt-mirror 1A05, which is mounted on a chip header or other structure. One or more control circuits, such as represented by the voltage controlled circuits 312 and 317, can supply a voltage differential to the rotating mirrors and actuators 311 and 316 to adjust the angles of the mirrors 311 and 316. These can be based on a user input: for example, a user input to voltage controller circuit 312 can adjust the angle of the mirror 311 to select a particular frequency center or frequency band and the control circuit 317 can be used to align the mirror 316 to direct the light transmitted by the filter 314 to the mirror 320.

In the embodiment shown in FIGS. 3A, 3B, and 3C, the transmission beam 315 that exits the optical filter 314 and transparent substrate 313, then hits a second rotating mirror 316 and is redirected towards a fixed mirror 320. (Note that an exception to mirror 320 being "fixed" will be discussed below.) After the beam is reflected off of the mirror 320, in the embodiment of FIGS. 3A-3C, it travels back along the optical path from mirror 320, retracing a path from mirror 320 to mirror 316, back through filter 314, reflecting off of mirror 311 and to an optical output port. The optical output port is not shown in FIG. 3A, as it will lie underneath the optical input port of fiber 301 and its end 301A, but can be seen in the side view of FIG. 3B as the output fiber 302 and its end 302A.

In the side view of FIG. 3C, the beam that is redirected by the second rotating mirror 316 is shown as beam 331. In the top view of FIG. 3A, this redirected beam is perpendicular to the fixed mirror 320. However, in the side view of FIG. 3C, beam 331 is offset from being perpendicular to the fixed mirror 320, by a small angle δ in the x-z plane. This small angle δ results from the input fiber 301 being off-set from the optical axis 326, as discussed above, in relation to FIG. 3B. The 332 beam that is reflected by fixed mirror 320 is therefore directed back towards the second rotating mirror 316, reflected by the second rotational mirror 316, and then passes through the optical filter 314 a second time. This second pass through optical filter 314 is at the same incident angle as the initial pass through the optical filter, but in the reverse direction. As the beam exits optical filter 314, it is reflected by the first rotating mirror 311, as indicated by beam 322 in FIG. 3B. The beam finally passes through lens 305, to be focused onto the fiber end 302A of the output optical fiber 302, also as shown in FIG. 3B. The optical path length from the lens 305 to the surface of the fixed mirror 320 is here taken to be close to the focal length of the lens 305, in order to facilitate good optical coupling from the input fiber 301 and the output fiber 302.

One effect of the beam passing through the optical filter 314 twice, before being directed to the output fiber 302, is that the overall tunable optical filter's −20 dB bandwidth is significantly reduced. This is defined as the width of the tunable optical filter's passband, measured 20 dB down from the optical power level at the center of the passband. In short, the two passes through the optical filter 314 result in significantly improved isolation of wavelengths that are adjacent to the wavelength or wavelength range being passed. One Figure of Merit (FOM) that may be used to assess the "steepness" of an optical filter's passband characteristic, can be defined as the −3 dB bandwidth of a bandpass filter, divided by its −20 dB bandwidth. A larger value for this FOM, implying that the −20 dB bandwidth is only slightly greater than the −3 dB bandwidth, indicates better or improved isolation of neighboring or adjacent wavelengths. An increased FOM for a thin film optical filter can be achieved by using a greater number of thin film coating layers, but this can make fabrication difficult. In the embodiment of FIGS. 3A-3C, the FOM of the overall tunable optical filter is greatly increased by having the beam pass through the same optical filter 314 twice. Additional optical filters having the same transmission spectrum as optical filter 314, or slightly different transmission spectrums, can be added in parallel to, or at a fixed angle to the optical filter 314. The additional optical filters would also be located between the two rotating mirrors, 311 and 316, to increase the overall tunable optical filter's FOM further, or to reshape the transmission spectrum by superposition of two or more filter spectra, respectively.

The transmission spectrum of an optical bandpass filter, in terms of its −3 dB and −20 dB bandwidths, is slightly dependent on the polarization state of the incident beam. To avoid a spectrum mis-match between the incoming beam, on its first pass through optical filter 314, and the returning beam, on its second pass through optical filter 314, a quarter-wave plate 318 (or a waveplate of some multiple of a quarter-wave) may be interposed somewhere between the optical filter 314 and the fixed mirror 320, so that the polarization state of the return beam is orthogonal to that of the incoming beam. This effectively cancels out the polarization dependence of the optical filter 314, resulting in reduced polarization-dependent loss (PDL) for the overall tunable optical filter. In FIG. 3A, the quarter-wave plate 318 is located between the second rotating mirror 316 and the fixed mirror 320, but in principle it could also be located between the optical filter 314 and the second rotating mirror 316.

As shown in FIG. 3A, both of the normals 311A and 316A of the rotating mirrors 311 and 316, respectively, should remain in the X-Y plane while their respective mirror rotates. However, the mechanical tolerances of placing the two rotating mirrors 311 and 316 along the optical beam path may not allow this. To overcome this problem, an extra pivot point or axis of rotation can be added to one or both of the rotating mirrors 311 and 316, to allow a slight angular correction, so that the normals 311A and 316A remain in the X-Y plane at all times. Furthermore, the "fixed" mirror 320 can also be constructed to be slightly rotating in order to keep its normal 320A, shown in FIG. 3C, within the X-Z plane. For example, the rotation of the mirror 320 can again be implemented similarly to the MEMS tilt-mirror 1A05, which is mounted on a chip header or other structure and a voltage controlled circuit or other control circuit (not shown in FIG. 3C) can be used to align the mirror 320. The extra pivot point or axis of rotation of one or more of the mirrors may also be used to intentionally and partially misalign the filtered optical beam from the output port of fiber 302, in order to introduce additional attenuation, without affecting the tuned wavelength or range of wavelengths.

The rotating mirrors 311 and 316, as well as mirror 320 if it is intended to have a rotating capability, can be actuated by a MEMS (Micro Electro-Mechanical System) structure, or even driven by micro motors, or other electro-magnetic forces. MEMS actuators are used here due to their small size, ease of fabrication and installation, and the ability to precisely control their tilt angles and range of motion, as discussed in U.S. Pat. Nos. 6,628,856 and 6,838,738. In FIGS. 3A and 3C, the MEMS structure or other actuators can be considered as included in the mirrors 311, 316, and 320 as these are represented in the figures, with the control circuits for mirrors 311 and 316 represented as the voltage controlled circuits 312 and 317, and where a similar control circuit can be included for the mirror 320.

As can be seen in the plot of FIG. 2B, the rate of change of the peak wavelength of a thin film optical bandpass filter, as a function of the beam's incident angle, increases with increasing incident angle. In other words, the wavelength tuning range achieved with an incident angle range of 10-20 degrees, is greater than the wavelength tuning range achieved with an incident angle range of 0-10 degrees. The angle of the optical filter 314, with respect to the two rotating mirrors, 311 and 316, can be adjusted to have some amount of minimum incident angle, in order to obtain increased wavelength tuning range, for a given amount of rotating mirror angular movement.

As illustrated in FIGS. 3A, 3B, and 3C, all of the optical elements, including items 301, 302, 305, 311, 314/313, 316, 318, and 320, are positioned or mounted in a common mainframe (not shown), whose material can be a metal, silicon, silicon nitride, silicon dioxide, aluminum nitride, aluminum oxide, or other semiconductor material. The thermal expansion coefficient of the mainframe material is here chosen to be close to the thermal expansion coefficients of the optical elements, to minimize thermal stress during temperature changes. The one or more control circuits (e.g., voltage controlled circuits 312 and 317) can be part of, or attached to, the common mainframe, or they may be separate elements, depending on the embodiment.

Figure 4A:
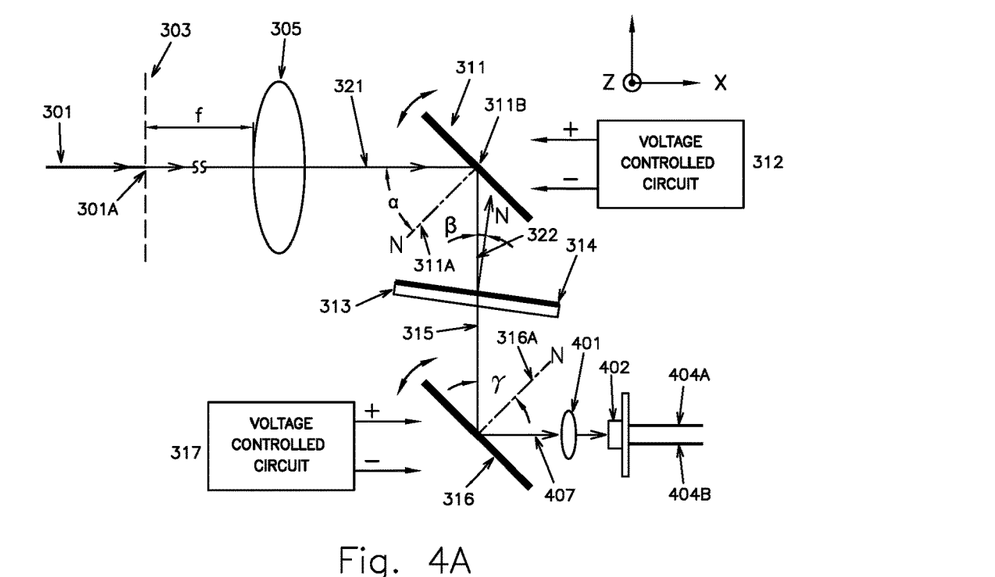
FIGS. 4A, 4B, and 4C show another embodiment comprising a thin film filter chip, and two rotating mirrors, in which the output optical beam is directed to a photodetector.
Figure 4B:
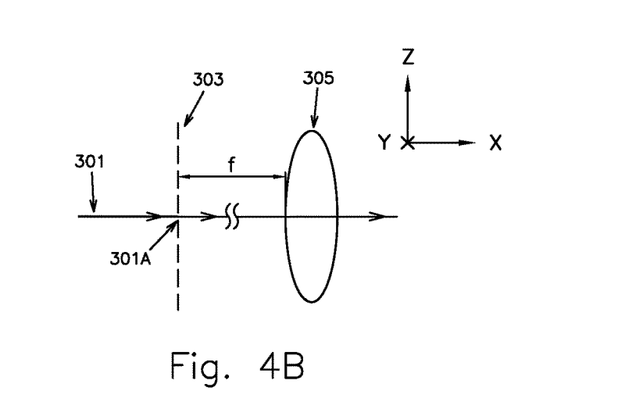
Figure 4C:
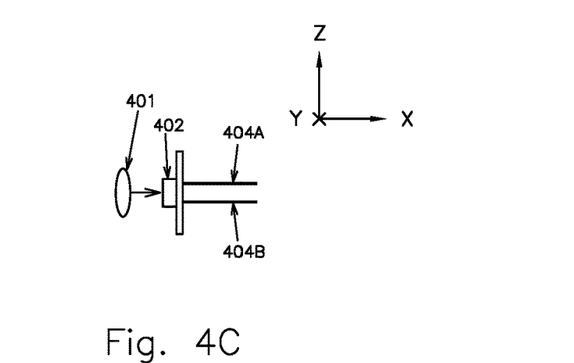

Another embodiment is shown in FIGS. 4A, 4B, and 4C, in which, rather than a mirror 320 reflecting the transmission spectrum of the optical filter 314 back towards the mirror 316 as illustrated in FIGS. 3A-3C, the transmission spectrum of the optical filter 314 is directed toward an optical output port to the right (as represented in the figures) of the lens 401. In the example of FIGS. 4A-4C, the optical output port is a photo-detector 402, in order to convert the optical signal to an electric signal, but in other embodiments the output port can be an optical fiber. In FIGS. 4A, 4B, and 4C, optical elements that correspond with optical elements shown in FIGS. 3A, 3B, and 3C, are labeled similarly. In FIG. 4A, the beam 315, carrying the transmission spectrum of optical filter 314, is reflected by the second rotating mirror 316. Rotating mirror 316 is positioned at a proper angle to re-direct the beam toward a photo-detector 402, via a small lens 401, having a focal length that is significantly shorter than that of the lens 305. The beam is then focused onto photo detector 402. The optical signal carried by the optical beam 407 is therefore converted by the photo-detector 402 to an electrical signal, which is then carried or conducted by two electrodes 404A and 404B. FIG. 4B, the partial side view of FIG. 4A, shows that in this embodiment there is only one input fiber 301, and no output fiber, to the left as represented in FIG. 4B. FIG. 4C shows another partial side view of FIG. 4A, to illustrate the relative positions of the incoming beam, lens 401, and photo-detector 402, in the X-Z plane. In embodiments where the output port is an optical fiber, the output optical fiber would be located similarly to the photo-detector.

A number of other embodiments using a similar arrangement of a thin film optical filter and two rotating mirrors are possible. For example, it is possible to add a photo-detector to the embodiment shown in FIGS. 3A, 3B, and 3C. In order to do so, the "fixed" mirror 320 can be implemented to pass a portion of the beam that is incident on it, while reflecting most of the optical power back toward rotating mirror 316 and optical filter 314. In this modified embodiment, a photo-detector and its associated lens could be placed "behind" the mirror 320, in order to detect or measure the fraction of the beam's optical power that passes through the partially-transmissive mirror 320.

Figure 5:
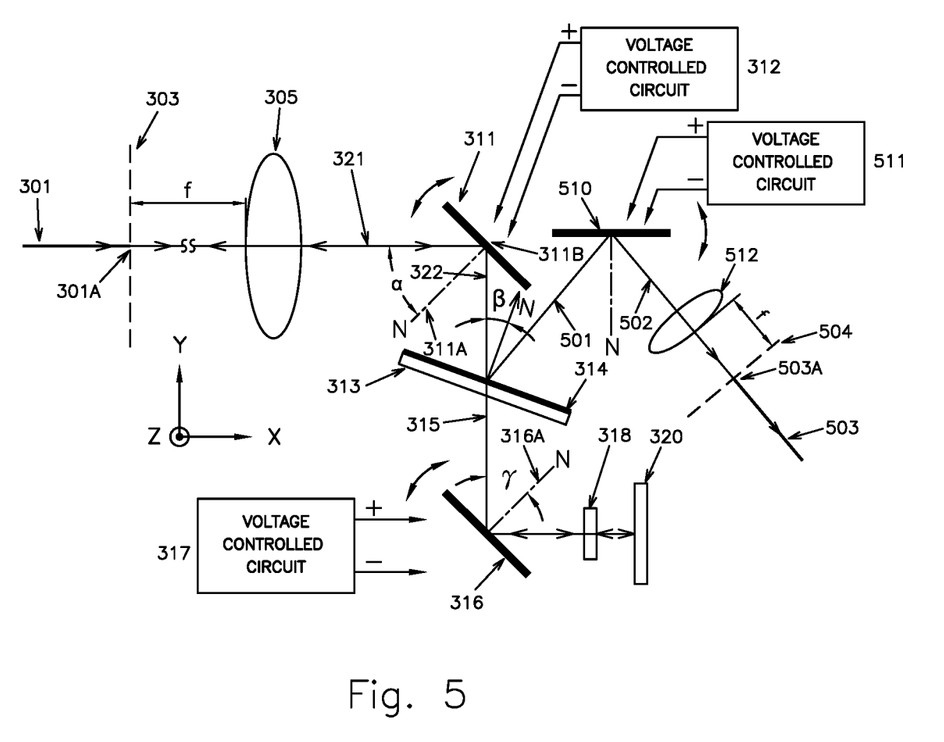
FIG. 5 shows yet another embodiment, comprising a three-port tunable optical filter, in which a selected wavelength or wavelength range is passed to one output fiber, and the unselected wavelengths or wavelength ranges of the original optical signal are passed to a second output fiber.

In the embodiments of both of FIGS. 3A-3C and of FIGS. 4A-4C, the optical path from the input port to the output port passes through the optical filter 314. In FIGS. 3A-3C the output port is shown as an optical fiber while for FIGS. 4A-4C is shown as a photo-detector, but for either set of embodiments the output port can be an optical fiber, photo-detector, or other form of optical output port. In both sets of embodiments, the first mirror 311 is placed at a position in the optical path intermediate to (or between, in term of the optical path) the input port 301 and the optical filter 314 and the angle of the mirror 311 is arranged so that the angle of incidence of the incoming light between results in the selected transmitted wavelength spectrum. Also in both sets of embodiments, the second mirror 316 is placed at a position in the optical path intermediate to (or between, in term of the optical path) the optical filter 314 and the output port, where the mirror 316 is arranged so that transmitted wavelength spectrum from the optical filter is directed to the output port. In the embodiment of FIGS. 3A-3C, the optical path from the second mirror 316 continues on to the mirror 320, from which it is reflected and continues back to mirror 316, optical filter 314, and mirror 311 before reaching the output port, such as optical fiber 302. The embodiments of FIGS. 4A-4C differ from the embodiments of FIGS. 3A-3C in that the optical path does not make a "return trip" through the optical filter 314, but rather goes from the second mirror 316 to an output port such as shown by the photo-detector 402 located similarly to the third mirror 320 of FIGS. 3A-3C. Both FIGS. 3A-3C and FIGS. 4A-4C present a two-port tunable optical filter, with one input port and one output port. FIG. 5 presents extensions to a three-port device, having one input port and two output ports.

FIG. 5 shows yet another set of embodiments, in this case a three-port tunable optical filter, in which a selected wavelength or wavelength range from an input port is passed to a first optical output port, and the unselected wavelengths or wavelength ranges of the original optical signal are passed to a second optical output port. For example, the input port and output ports can be optical fibers. This form of tunable optical filter has applications in reconfigurable optical add-drop multiplexers, or ROADMs, as the output fiber carrying the selected wavelength or wavelength range would be configured as a ROADM "drop" port, and the output fiber carrying the unselected wavelengths or wavelength ranges would be configured as the ROADM's "express traffic" port.

The embodiment shown in FIG. 5 is basically similar to the embodiment shown in FIGS. 3A, 3B, and 3C, with the addition of a third rotating mirror (or fourth mirror overall if including mirror 320). As described earlier in relation to FIG. 3A, the multi-wavelength beam 321 is reflected by rotating mirror 311 onto optical filter 314, at an incident angle $\beta$. The wavelength or wavelength range that is being selected by optical filter 314, passes through optical filter 314 as optical beam 315, to rotating mirror 316. As described earlier, in relation to FIGS. 3A, 3B, and 3C, this beam, carrying the selected wavelength or wavelength range, is eventually coupled to output fiber 302, after passing through optical filter 314 a second time, in the reverse direction, in the same manner as described for the embodiment shown in FIGS. 3A, 3B, and 3C. (Note that, as in FIG. 3A, output fiber 302 is not visible in the top view shown in FIG. 5, but is located adjacent to input fiber 301, as was shown in FIG. 3B.) Meanwhile, the wavelengths or wavelength ranges that are not passed through optical filter 314, are reflected off of the surface of optical filter 314, as optical beam 501, towards rotating mirror 510. Rotating mirror 510 is positioned to reflect beam 501 as beam 502, through lens 512. Lens 512 focuses beam 502 onto the end face 503A of the second output fiber 503.

The positions of optical filter 314 (and its substrate 313), and rotating mirror 510, are such that the beam 501 that is reflected by the optical filter 314, is directed onto rotating mirror 510, without being blocked by rotating mirror 311. These positioning constraints may serve to partially dictate the location and positioning of the second output fiber 503. Generally speaking, the second output fiber 502 will typically be located on the opposite side of the overall device structure, compared to co-located input fiber 301 and first output fiber 302. The use of separate rotating mirrors 316 and 510, to direct the two output beams 322 and 501, to their respective output fibers 302 and 502, serves to reduce the difficulty in achieving efficient optical coupling to the two output fibers. Also note that if rotating mirrors with a second axis of rotation are used, it will be possible to provide additional attenuation to one or both of the optical signals that are sent to output fibers 302 and 502, respectively.

It should be noted that in the embodiment shown in FIG. 5, the selected wavelength or wavelength range that is directed to output fiber 302, has passed through optical filter 314 twice. However, the unselected wavelengths or wavelength ranges that are directed to output fiber 503, have only been reflected by optical filter 314 a single time. In a variation of the embodiment shown in FIG. 5, the lens 512 could be replaced by a "fixed" mirror (and wave plate), analogous to "fixed" mirror 320 and wave plate 318. The additional "fixed" mirror (not shown in FIG. 5) would redirect beam 502 back past rotating mirror 510, so that the beam would be reflected by optical filter 314 a second time. (As for mirror 320, and as discussed above with respect to FIG. 3C, the additional fixed mirror could also have some amount of rotational capability.) After being reflected by optical filter 314, the beam would be directed by rotating mirror 311 towards an output fiber that would be essentially co-located with input fiber 301 and output fiber 302. In this additional embodiment, the alignment of the various optical elements is made more difficult by the fact that rotating mirror 311 is directing two independent optical beams to the two output fibers. For this reason, it may be beneficial to provide a second axis of rotation to one or more of the rotating mirrors 311, 316, and 510, and possibly to provide some level of adjustability to the two "fixed" mirrors. In addition to achieving greater isolation for the "express traffic" output, another potential advantage of this embodiment, compared to the embodiment shown in FIG. 5, is that the input fiber and both output fibers are located on the same side of the device, and may be held in place by a single fiber ferrule. This may provide advantages to users of the device, as the device is integrated with other optical components.

In another variation of the embodiments of FIG. 5, rather than being based on the embodiment of FIGS. 3A-3C for the selected wavelength's output port (the ROADM "drop" port), a three port embodiment can be based on the embodiment of FIGS. 4A-4C, where the output of the "drop" port only transits the optical filter 314 once and the first output port would be located similarly to the photo-detector 402. For the "express traffic" of the second output port, this can be configured to only be incident on the optical filter 314 a single time, such as is illustrated in FIG. 5, or, alternatively, the "express traffic" can be reflected back to the optical filter 314 and then be reflected by it a second time, as described in the preceding paragraph.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

It is claimed:

1. An optical device, comprising:
   an input port configured to provide an input beam of light;
   a first output port configured to provide a first output beam of light from the optical device;
   a fixed optical filter located in an optical path from the input port and to the output port, the optical filter configured to transmit light having a wavelength or range of wavelengths dependent on an angle with which a beam of light is incident thereupon;
   a first mirror located in the optical path intermediate to the input port and the optical filter, the first mirror configured to reflect a beam of light incident thereon from the input port onto the fixed optical filter and rotatable in response to a first control signal to vary the angle with which the incident beam of light reflected from the input port is incident upon the fixed optical filter; and
   a second mirror located in the optical path intermediate to the optical filter and the first output port, the second mirror rotatable in response to a second control signal to direct a beam of light transmitted by the optical filter back through the optical filter, onto the first mirror and to the first output port.

2. The optical device of claim 1, further comprising:
one or more control circuits configured to provide the first control signal and the second control signal in response to a user input.

3. The optical device of claim 1, wherein:
the first mirror is a Micro-Electro-Mechanical Systems (MEMS) tilt-mirror; and
the second mirror is a MEMS tilt-mirror.

4. The optical device of claim 1, wherein the optical filter comprises a stack of dielectric thin films coated on a glass substrate.

5. The optical device of claim 1, wherein the optical filter is a band pass filter.

6. The optical device of claim 1, wherein the optical filter is a long pass filter.

7. The optical device of claim 1, wherein the optical filter is a short pass filter.

8. The optical device of claim 1, further comprising
a third mirror located in the optical path intermediate to the second mirror and the first output port, the third mirror configured to reflect the beam of light directed thereonto back towards the second mirror.

9. The optical device of claim 8, wherein the third mirror is rotatable in response to a third control signal.

10. The optical device of claim 8, further comprising:
a quarter wave plate located in the optical path between the second mirror and the third mirror.

11. The optical device of claim 1, further comprising:
a lens located in the optical path between the input port and the first mirror, the lens configured to collimate the beam of light from the input port onto the first mirror.

12. The optical device of claim 1, further comprising
a second output port configured to provide a second output beam from light reflected from the optical filter.

13. The optical device of claim 12, further comprising:
a third mirror in an optical path from the optical filter to the second output port, the third mirror configured to reflect light reflected thereonto from the optical filter towards the second output port.

14. The optical device of claim 13, wherein the third mirror is configured to reflect light reflected thereonto from the optical filter towards the second output port along an optical path in which light reflected onto the third mirror is reflected back onto the optical filter.

15. The optical device of claim 1, wherein the input port is configured to hold a first optical fiber and the first output port is configured to hold a second optical fiber.

16. The optical device of claim 1, wherein the first output port is configured to hold a photo-detector.

17. The optical device of claim 1, wherein the optical filter is a notch pass filter.

18. The optical device of claim 1, further comprising:
a quarter wave plate located in the optical path between the fixed optical filter and the second mirror.

19. An optical device, comprising:
an optical input port configured to provide an input beam of light;
a first optical output port configured to provide a first output beam of light from the optical device;
an optical filter, the optical filter configured to transmit light having a wavelength or range of wavelengths dependent on an angle with which a beam of light is incident thereupon;
a first rotatable mirror configured to reflect the input beam of light incident thereon from the input port onto the optical filter; and
a second rotatable mirror configured to reflect the transmitted light of the input beam of light incident thereupon from the optical filter; and
one or more control circuits connected to the first rotatable mirror and the second rotatable mirror and connected to receive a user input, the one or more control circuits configured to:
align the first rotatable mirror to direct the input beam of light to be incident upon the optical filter with an angle dependent upon the user input; and
align the second rotatable mirror to direct to the transmitted light of the input beam of light back through the optical filter, onto the first mirror and to the first output port to provide the first output beam of light.

20. The optical device of claim 19, wherein the optical filter comprises a stack of dielectric thin films coated on a glass substrate.

21. The optical device of claim 19, further comprising:
a third mirror located in the optical path intermediate to the second mirror and the first output port, the third mirror configured to reflect the beam of light directed thereonto back towards the second mirror.

22. The optical device of claim 21, further comprising:
a quarter wave plate located in the optical path between the second mirror and the third mirror.

23. The optical device of claim 19, further comprising
a second output port configured to provide a second output beam from light reflected from the optical filter; and
a third mirror in an optical path from the optical filter to the second output port, the third mirror configured to reflect light reflected thereonto from the optical filter towards the second output port.

24. The optical device of claim 23, wherein the third mirror is configured to reflect light reflected thereonto from the optical filter towards the second output port along an optical path in which light reflected onto the third mirror is reflected back onto the optical filter.

25. The optical device of claim 19, wherein the first output port is configured to hold a photo-detector.

26. The optical device of claim 19, wherein:
the first mirror is a Micro-Electro-Mechanical Systems (MEMS) tilt-mirror; and
the second mirror is a MEMS tilt-mirror.

27. The optical device of claim 19, further comprising:
a quarter wave plate located in the optical path between the optical filter and the second mirror.

* * * * *